United States Patent
Kuchiyama et al.

(10) Patent No.: US 9,297,061 B2
(45) Date of Patent: Mar. 29, 2016

(54) TRANSPARENT ELECTROCONDUCTIVE FILM AND PROCESS FOR PRODUCING THE SAME

(75) Inventors: Takashi Kuchiyama, Settsu (JP); Kenji Yamamoto, Kobe (JP)

(73) Assignee: KANEKA CORPORATION, Osaka (JP)

( * ) Notice: Subject to any disclaimer, the term of this patent is extended or adjusted under 35 U.S.C. 154(b) by 1828 days.

(21) Appl. No.: 12/449,303

(22) PCT Filed: Feb. 15, 2008

(86) PCT No.: PCT/JP2008/052562
§ 371 (c)(1), (2), (4) Date: Jul. 31, 2009

(87) PCT Pub. No.: WO2008/099932
PCT Pub. Date: Aug. 21, 2008

(65) Prior Publication Data
US 2010/0089615 A1 Apr. 15, 2010

(30) Foreign Application Priority Data

Feb. 16, 2007 (JP) .................. 2007-036821
Mar. 23, 2007 (JP) .................. 2007-077589

(51) Int. Cl.
*B32B 9/00* (2006.01)
*C23C 14/08* (2006.01)
*C03C 17/34* (2006.01)

(52) U.S. Cl.
CPC ........... *C23C 14/086* (2013.01); *C03C 17/3441* (2013.01); *C03C 2217/944* (2013.01); *C03C 2218/365* (2013.01)

(58) Field of Classification Search
None
See application file for complete search history.

(56) References Cited

U.S. PATENT DOCUMENTS 5,562,952 A * 10/1996 Nakahigashi et al. ......... 427/534
6,078,139 A *  6/2000 Ochiai et al. .................. 313/582

(Continued)

FOREIGN PATENT DOCUMENTS

| JP | 4-048515 | 2/1992 |
| JP | 7-081979 | 3/1995 |

(Continued)

OTHER PUBLICATIONS

English translation of the International Preliminary Report on Patentability.
International Search Report issued Jun. 3, 2008 in the International (PCT) Application of which the present application is the U.S. National Stage. PCT/JP2008/052562.

*Primary Examiner* — Daniel J Schleis
(74) *Attorney, Agent, or Firm* — Wenderoth, Lind & Ponack, L.L.P.

(57) ABSTRACT

In a transparent electroconductive film including a transparent substrate and a transparent electroconductive oxide layer disposed on the transparent substrate, when the transparent electroconductive oxide layer is composed of zinc oxide, the surface resistivity of the transparent electroconductive oxide layer increases with time and thus it has been difficult to obtain a transparent electroconductive film stable against an environmental variation. Consequently, hard carbon films are provided on the surfaces of a transparent electroconductive oxide layer including at least one layer and containing zinc oxide as a main component in "the order of transparent substrate-hard carbon film-transparent electroconductive oxide layer-hard carbon film" or "the order of hard carbon film-transparent substrate-transparent electroconductive oxide layer-hard carbon film". Alternatively, an organosilicon compound covering layer is provided on a surface of the transparent electroconductive oxide layer. Thereby, the water contact angle can be 75 degrees or more, and an increase in the resistivity of the transparent electroconductive oxide layer can be suppressed.

4 Claims, 1 Drawing Sheet

(56) References Cited

U.S. PATENT DOCUMENTS

| | | |
|---|---|---|
| 6,605,826 B2 * | 8/2003 | Yamazaki et al. .............. 257/72 |
| 2002/0037398 A1 | 3/2002 | Tofuku et al. |
| 2007/0051926 A1 | 3/2007 | Nakayama et al. |

FOREIGN PATENT DOCUMENTS

| | | |
|---|---|---|
| JP | 2000-212514 | 8/2000 |
| JP | 2001-283643 | 10/2001 |
| JP | 2005-268113 | 9/2005 |

* cited by examiner

US 9,297,061 B2

TRANSPARENT ELECTROCONDUCTIVE FILM AND PROCESS FOR PRODUCING THE SAME

This application is a nationalization of PCT application PCT/JP2008/052562 filed on Feb. 15, 2008, claiming priority based on Japanese Application No. 2007-036821 filed on Feb. 16, 2007, and Japanese Application No. 2007-077589 filed on Mar. 23, 2007, the contents of which are incorporated herein by reference in their entirety.

TECHNICAL FIELD

The present invention relates to a transparent electroconductive film in which an environmental variation in the surface resistivity can be suppressed while maintaining transparency, and which is to be mainly used in materials for a touch panel, a plasma display panel (PDP), a liquid crystal display (LCD), and an electroluminescence (EL) display; applications to a solar cell, a surface acoustic wave element, a window glass coating for blocking infrared rays or the like, a gas sensor, a prism sheet utilizing nonlinear optics, a transparent magnetic material, an optical recording element, an optical switch, an optical waveguide, an optical splitter, and a photoacoustic material; and a high-temperature heat-generating heater material.

BACKGROUND ART

As a transparent electroconductive layer included in a transparent electroconductive film used as a material of a touch panel or display, or used in a solar cell or the like, indium tin oxide (ITO), tin oxide, zinc oxide, or the like is widely used. It is known that such a transparent electroconductive layer is formed by, for example, a physical vapor deposition method (PVD method) such as a magnetron sputtering method or a molecular beam epitaxy method; a chemical vapor deposition method (CVD method) such as thermal CVD or plasma CVD; or an electroless method. Regarding the transparent electroconductive layer used in such a transparent electroconductive film, it is necessary to ensure sufficient transparency, and it is also necessary that variations in characteristics such as the surface resistivity and optical properties be small. Indium tin oxide (ITO) is a material that is excellent in the above characteristics and is widely used as a transparent electroconductive layer currently. However, indium used as a raw material may be exhausted and thus searching for an alternative material to ITO has become an urgent task in terms of resources and the cost. Zinc oxide is an abundant material in terms of resources and has attracted a great deal of attention as an alternative material to ITO. However, a transparent electroconductive layer composed of zinc oxide generally has a property that the surface resistivity increases when the transparent electroconductive layer is left to stand in air in the form of a thin film. Accordingly, in order to use zinc oxide as a transparent electroconductive layer, it is necessary to take measures, for example, to excessively increase the thickness of the layer. As a measure to counter an increase in the surface resistivity, Patent Document 1 describes that an aqueous solution containing a trivalent metal cation is used as a modifying agent for a zinc oxide film to decrease the rate of variation in the surface resistivity to 1.2 times or less.
Patent Document 1: Japanese Unexamined Patent Application Publication No. 2001-39712

DISCLOSURE OF INVENTION

Problems to be Solved by the Invention

Metal oxides used as a transparent electroconductive oxide layer (hereinafter also referred to as "transparent electroconductive layer") generally have a property that the surface resistivity increases when the metal oxides are left to stand in air. It is believed that this is because oxygen and moisture in air are taken in crystal defects of the metal oxides, thereby changing the carrier concentration. In particular, a transparent electroconductive oxide layer composed of a zinc oxide thin film with a thickness of 5,000 Å or less has a problem that an environmental variation in the surface resistivity is large, and therefore cannot be used in a transparent electroconductive film.
A measure to counter such an increase in the surface resistivity is to increase the thickness of the transparent electroconductive layer. However, in this method, there remains a problem in terms of transparency and it is difficult to control the surface resistivity to be a desired value, which prevents practical application. Alternatively, in the case where the surface resistivity is stabilized by a treatment with an aqueous solution or a coating liquid containing a modifying agent for a transparent electroconductive layer, the film thickness may become uneven and coating defects such as dripping and foaming are readily generated depending on the liquid state due to the temperature of the coating liquid and the like and the coating environment. Thus, it is difficult to optimize and control the coating conditions, and these problems may impede mass production.
In a surface treatment by vapor-phase deposition, plasma is used in many cases. In particular, in the case where hydrogen plasma is used, when ITO or tin oxide is used as a transparent electroconductive layer, indium or tin is reduced, and consequently, metal indium or tin is precipitated. As a result, characteristics of the resulting transparent electroconductive film are changed. Therefore, a surface treatment by vapor-phase deposition cannot be employed for forming a transparent electroconductive layer containing ITO or tin oxide as a main component. Patent Documents 2 to 4 have reported that, by covering a transparent electroconductive layer with a hard carbon film, physical durability is improved mainly in an application to a touch panel. However, in such a hard carbon film is not effective to the durability under a high-temperature and high-humidity environment which is described in the present invention. Patent Document 5 has reported a solar cell covered with a diamond-like carbon formed by a plasma CVD method. However, under the conditions for depositing a diamond carbon film described therein, it is impossible to prepare a zinc oxide transparent electroconductive film having good durability under a high-temperature and high-humidity environment which is required in the present invention.
As for the case where a material other than a hard carbon film is used, the method described in Patent Document 1 has been reported. From the standpoint of an organosilicon compound covering layer, Patent Documents 6 to 8 have reported techniques in which a solution of a silane coupling agent diluted with an organic solvent is applied to a base material. Furthermore, Patent Document 9 has reported that forming an organopolysilane compound layer has an effect of improving durability.
Patent Document 2: Japanese Unexamined Patent Application Publication No. 2001-283643
Patent Document 3: Japanese Unexamined Patent Application Publication No. 2003-34860

Patent Document 4: Japanese Unexamined Patent Application Publication No. 2003-109434
Patent Document 5: Japanese Unexamined Patent Application Publication No. 2001-127315
Patent Document 6: Japanese Unexamined Patent Application Publication No. 9-39148
Patent Document 7: Japanese Unexamined Patent Application Publication No. 9-39149
Patent Document 8: Japanese Unexamined Patent Application Publication No. 8-92402
Patent Document 9: Japanese Unexamined Patent Application Publication No. 8-109047

Means for Solving the Problems

In order to solve the above problems, the inventors of the present invention have conducted intensive studies and found that a transparent electroconductive film in which a variation in the surface resistivity under a high-temperature and high-humidity environment is small and transparency is not impaired can be provided by using zinc oxide as a main component of an transparent electroconductive layer and covering both surfaces of the transparent electroconductive layer and/or both surfaces of the transparent electroconductive layer with electroconductive hard carbon films.

Specifically, the present invention relates to the following: (1) A transparent electroconductive film including a transparent substrate; a transparent electroconductive oxide layer including at least one layer and containing zinc oxide as a main component, the transparent electroconductive oxide layer being disposed on the transparent substrate; and hard carbon films each having a thickness in the range of 10 to 300 Å and disposed on a surface of the transparent electroconductive oxide layer, wherein the transparent substrate, the hard carbon film, the transparent electroconductive oxide layer, and the hard carbon film are disposed in that order, or the hard carbon film, the transparent substrate, the transparent electroconductive oxide layer, and the hard carbon film are disposed in that order. (2) The transparent electroconductive film described in (1), wherein the hard carbon films satisfy (A) to (D) below at the same time: (A) a hydrogen atom that forms a carbon-hydrogen bond is contained in the structure; (B) the refractive index is in the range of 1.65 to 1.95; (C) a proportion of $SP^3$ in bonds measured by X-ray photoelectron spectroscopy is 65% or more; and (D) when the hard carbon films are formed on the transparent electroconductive oxide layer to prepare a transparent electroconductive film, the transparent electroconductive film exhibits electrical conductivity. (3) A transparent electroconductive film including a transparent substrate; a transparent electroconductive oxide layer including at least one layer and containing zinc oxide as a main component, the transparent electroconductive oxide layer being disposed on the transparent substrate; and a covering layer that is disposed on a surface of the transparent electroconductive oxide layer and that satisfies (E) to (G) below at the same time: (E) a water contact angle is 75 degrees or more; (F) the covering layer is composed of an organosilicon compound covering layer; and (G) the film thickness is in the range of 5 to 50 Å. (4) The transparent electroconductive film described in (3), wherein the organosilicon compound covering layer is obtained by a condensation reaction of an organosilicon compound having an ethoxy group or/and a methoxy group that produce a silanol group by a hydrolysis reaction at least one end of its molecule and an organic functional group at the other end thereof, and the organic functional group is composed of a fluoroalkyl group or/and a linear carbon atomic group having four or more carbon atoms. (5) The transparent electroconductive film described in any one of (1) to (4), wherein when the transparent electroconductive film is left to stand in an atmosphere at a temperature of 60° C. and a relative humidity of 90% for 10 days, a rate of variation of the surface resistivity is 1.1 times or less the surface resistivity measured immediately after the film formation on the substrate. (6) A process for producing the transparent electroconductive film described in (1) or (2), wherein the hard carbon films are formed by radio-frequency plasma chemical vapor deposition (CVD), and methane gas and hydrogen gas used as raw material gases are prepared as a mixed gas so as to satisfy the relationship represented by formula 1 below:

$$0.04 \leq V(CH_4)/(V(CH_4)+V(H_2)) \leq 0.1 \quad \text{(Formula 1)}$$

wherein $V(CH_4)$ represents the flow rate of the methane gas and $V(H_2)$ represents the flow rate of the hydrogen gas. (7) A process for producing the transparent electroconductive film described in (3) or (4), wherein the organosilicon compound covering layer is formed by CVD in which an organosilicon compound and water are separately introduced in a reaction system, and a hydrolysis reaction is conducted while maintaining a substrate temperature in the range of 100° C. to 130° C. in the reaction system.

Advantages

The use of the transparent electroconductive film of the present invention can provide a transparent electroconductive film in which a variation in the surface resistivity of a transparent electroconductive oxide layer is small and transparency can be sufficiently ensured. In the transparent electroconductive film of the present invention, a zinc oxide transparent electroconductive layer with a small thickness, which has not previously been able to be used, can be used. Specifically, when a transparent electroconductive film in which a surface of the transparent electroconductive oxide layer is covered with a hard carbon film or both surfaces of the transparent electroconductive oxide layer are covered with hard carbon films is left to stand in an atmosphere at a temperature of 60° C. and a relative humidity of 90% for 10 days, the rate of variation of the surface resistivity can be 1.1 times or less the initial resistivity.

Figure 1:
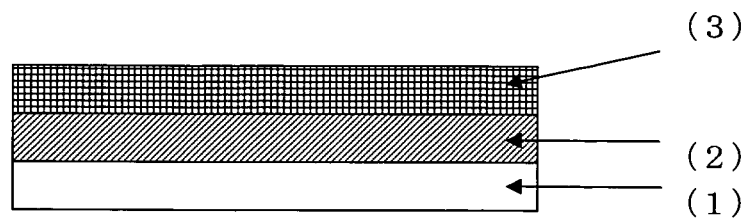
FIG. 1 is a cross-sectional explanatory view 1 of a transparent electroconductive film.

REFERENCE NUMERALS 1 substrate
2 transparent electroconductive oxide layer
3 covering layer (hard carbon layer or organosilicon compound covering layer)

BEST MODES FOR CARRYING OUT THE INVENTION

A first aspect of the present invention provides "a transparent electroconductive film including a transparent substrate; a transparent electroconductive oxide layer including at least one layer and containing zinc oxide as a main component, the transparent electroconductive oxide layer being disposed on the transparent substrate; and hard carbon films each having a thickness in the range of 10 to 300 Å and disposed on a surface of the transparent electroconductive oxide layer, wherein the transparent substrate, the hard carbon film, the transparent electroconductive oxide layer, and the hard carbon film are disposed in that order, or the hard carbon film, the transparent substrate, the transparent electroconductive oxide layer, and the hard carbon film are disposed in that order, and a process for producing the same". A second aspect of the present invention provides "a transparent electroconductive film including a transparent substrate; and a transparent electroconductive oxide layer including at least one layer and containing zinc oxide as a main component, the transparent electroconductive oxide layer being disposed on the transparent substrate, wherein a covering layer that satisfies (E) to (G) below at the same time is provided on a surface of the transparent electroconductive oxide layer: (E) a water contact angle is 75 degrees or more; (F) the covering layer is composed of an organosilicon compound covering layer; and (G) the film thickness is in the range of 5 to 50 Å.

A hard carbon film typically represented by diamond-like carbon is coated in order to decrease surface friction. Furthermore, recently, an application to, for example, a low-dielectric-constant film used in a solar cell or a compound semiconductor high-speed electronic device has been expected (Non-Patent Document 1).

Non-Patent Document 1: Handbook of diamond-like carbon films, from page 495 (published by NTS Inc.).

For a transparent electroconductive layer used in a transparent electroconductive film, it is necessary that a sufficient transparency be ensured, and in addition, the surface resistivity can be controlled and the variation thereof be small. The present invention focuses on a good gas-barrier property of a hard carbon film and a feature thereof that a low percentage of water absorption can be realized even with an extremely small film thickness. Consequently, it was found that a variation in the surface resistivity, which is one of the problems regarding a transparent electroconductive oxide, can be suppressed by coating a hard carbon film on a transparent electroconductive layer without changing transparency of the transparent electroconductive layer.

Furthermore, in a vapor-phase deposition method, which is usually employed as a method of forming a hard carbon film, a surface treatment with a hard carbon film can be realized by using zinc oxide, in which a reductive reaction does not occur in hydrogen plasma, as the transparent electroconductive layer. Thereby, zinc oxide can be used in an extremely small thickness range, in which zinc oxide has not previously been able to be used because of a large environmental variation in the surface resistivity. As a result, it is expected that the use of a zinc oxide transparent electroconductive layer is significantly advanced.

Figure 2:
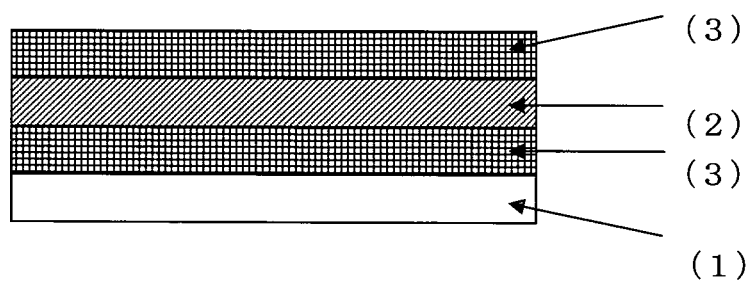
FIG. 2 is a cross-sectional explanatory view 2 of a transparent electroconductive film.
Figure 3:
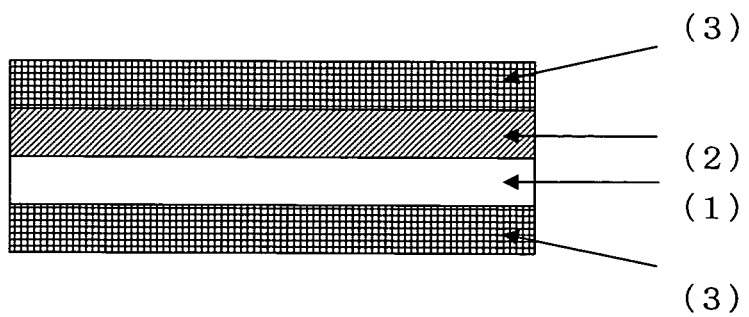
FIG. 3 is a cross-sectional explanatory view 3 of a transparent electroconductive film.

Typical embodiments of a transparent electroconductive film according to the present invention will now be described. FIGS. 1 to 3 are cross-sectional explanatory views of a transparent electroconductive film according to the present invention. This transparent electroconductive film includes a substrate 1 having a thickness in the range of 0.05 to 40 mm and a transparent electroconductive oxide layer 2 disposed on the substrate 1 and containing zinc oxide as a main component. A covering layer 3 is formed on a surface of the transparent electroconductive oxide layer (FIG. 1), both surfaces of the transparent electroconductive oxide layer (FIG. 2), or both surfaces of the transparent electroconductive film (FIG. 3).

The material that can be used as the substrate 1 is not limited to a hard material or a soft material as long as the material is colorless and transparent at least in the visible light region and a transparent electroconductive layer can be formed on the material. Examples of the hard material include substrates made of glass such as soda glass or borosilicate glass, ceramics, and hard plastics. Examples of the soft material include films made of polyesters such as polyethylene terephthalate (PET), polybutylene terephthalate (PBT), or polyethylene naphthalate (PEN), cycloolefin resins, polycarbonate resins, and polyimide resins. Among these, in olefin resins, which have particularly low moisture permeability, a moisture barrier property is improved by forming a hard carbon film on the substrate, and thus a higher effect can be expected to the stabilization of the surface resistivity.

In order to improve the adhesiveness of the transparent electroconductive layer and hard carbon film, a surface treatment may be performed on the substrate 1. Examples of the surface treatment include a primer treatment using a silane coupling agent and a treatment of thin-film coating of an adhesive. The treatment method is not particularly limited, and any method may be used as long as a surface of the substrate can be uniformly treated. Examples of the method include a spray application, a dipping application, a roll coating method, a spin coating method, and a CVD method.

Among transparent electroconductive oxides, examples of the material of the transparent electroconductive layer 2 of the present invention include zinc oxide, tin oxide, indium oxide, mixtures thereof, and titanium oxide. From the standpoint of a high transparency and a feature that a reductive reaction does not occur in hydrogen plasma generated during deposition of a hard carbon film, zinc oxide is used. In order to control or stabilize the resistivity, a doping agent may be added to the transparent electroconductive oxide. Examples of the doping agent include, but are not particularly limited to, compounds containing aluminum, gallium, or boron; and compounds containing phosphorus or nitrogen.

A method for forming the transparent electroconductive layer is not particularly limited as long as a uniform thin film can be formed by the method. Examples thereof include vapor-phase deposition methods such as PVD methods e.g., sputtering and vapor deposition, and various CVD methods. In addition to these methods, another example thereof is a method of applying a solution containing a raw material of the transparent electroconductive layer by a spin coating method, a roll coating method, a spray application, a dipping application, or the like, and then performing a heat treatment or the like to form the transparent electroconductive layer. From the standpoint that a thin film on the order of nanometers is easily formed, a vapor-phase deposition method is preferable.

When the transparent electroconductive layer is formed by a vapor-phase deposition method, the temperature of the substrate is preferably in the range of room temperature to 500° C., and further preferably in the range of room temperature to 300° C., though it depends on the softening temperature of the substrate. If the temperature of the substrate is too low, the deposition rate of the transparent electroconductive layer decreases, thereby decreasing the productivity. In addition, since crystal growth of the transparent electroconductive layer is not accelerated, transparency of the resulting layer may be degraded. If the temperature of the substrate is too high, thermal oxidation of the zinc oxide transparent electroconductive layer readily occurs and distortion of the substrate is readily formed. In addition, the time required for heating the substrate increases, thereby decreasing the productivity. Plasma discharge may be used for forming the transparent electroconductive layer, as required. The plasma power is not particularly limited, but is preferably in the range of 0.1 to 15 W/cm$^2$ from the standpoint of productivity and crystallinity.

If the power is too low, deposition of the layer may not be performed. On the other hand, if the power is too high, the deposited transparent electroconductive layer may be subjected to reverse sputtering or the transparent electroconductive layer may be damaged. Gases that are used in an ordinary vapor-phase deposition method can be used as a carrier gas during the formation of the transparent electroconductive layer. For example, argon, hydrogen, oxygen, or nitrogen gas can be used. The thickness of the transparent electroconductive layer 2 is preferably in the range of 50 to 5,000 Å. When the thickness of the transparent electroconductive layer is small, the electrical conductivity of the transparent electroconductive layer is extremely low and thus an effective transparent electroconductive film cannot be obtained. On the other hand, when the thickness of the transparent electroconductive layer is large, the transparency may be decreased and the production cost may be increased.

As the covering layer 3, a hard carbon film or an organosilicon compound covering layer is used. A detailed description thereof will be made below. An important feature in the present invention is that the water contact angle of the surface of the covering layer 3 is 75 degrees or more when measured by a θ/2 method using a contact angle meter CA-X type manufactured by Kyowa Interface Science Co., Ltd. It is believed that as the water contact angle increases, water repellency of the surface improves, and consequently, the durability of the transparent electroconductive film under a high-temperature and high-humidity environment is improved. The contact angle measures by the above method varies depending on the measurement environment. The higher the temperature, the lower the contact angle. In the present invention, for example, when the water contact angle is 75 degrees or more even at a high temperature of 60° C. or higher, a transparent electroconductive film that is effective in the present invention can be prepared.

When a hard carbon film is used as the covering layer, the hard carbon film is composed of a compound containing a carbon atom as a main component, such as diamond-like carbon, carbon nanotube, or fullerene. The electrical conductivity of the film can be improved by doping nitrogen, phosphorus, boron, or the like, but a sufficient electrical conductivity can be expected even when such a doping is not performed. As for a method of preparing such a hard carbon film, a hard carbon film necessary for the present invention can be formed by using a radio-frequency (RF) plasma CVD method. Methane gas and hydrogen gas are used as raw material gases in the RF plasma CVD method. By controlling the volume ratio of the gases, characteristics of the hard carbon film can be controlled. In order to provide characteristics that are important in the present invention, it is necessary to control the raw material gases to be in the range represented by formula 1 below:

$$0.04 \leq V(CH_4)/(V(CH_4)+V(H_2)) \leq 0.1 \quad \text{(Formula 1)}$$

wherein $V(CH_4)$ represents the flow rate of the methane gas and $V(H_2)$ represents the flow rate of the hydrogen gas. The volume ratio can be controlled with a good accuracy by installing a mass flow controller in a deposition apparatus. The gas volume ratio affects mainly the water contact angle. If the gas volume ratio is out of the above range, the water contact angle that is necessary for the present invention cannot be obtained, resulting in a decrease in the durability under a high-temperature and high-humidity environment. The power of a power supply is preferably in the range of 0.05 to 15 W/cm². If the power is too low, the deposition rate becomes low, and the productivity may be significantly affected. On the other hand, an excessively high power is not preferable because the transparent electroconductive oxide layer of a base material may be etched by an ionized gas.

The thickness of the hard carbon film is preferably in the range of 10 to 300 Å, and particularly preferably in the range of 20 to 200 Å from the standpoint of use. If the thickness of the hard carbon film is small, an effect of improving the durability is insufficient. On the other hand, a large thickness may cause a decrease in the electrical conductivity.

It is necessary that the hard carbon film contain hydrogen in its structure. The hydrogen content is not particularly limited. When the hydrogen content is 10% to 60% of the number of total atoms, a hard carbon film that is effective in the present invention can be formed. If the hydrogen content is low, as in the hard carbon films described in Patent Documents 2 to 4, an effect on durability cannot be obtained. On the other hand, a high hydrogen content is not preferable because scratch hardness decreases, thereby decreasing the physical impact resistance. In addition, the electrical conductivity decreases, and the electrical properties of the hard carbon film become the same as those of insulating compounds.

The refractive index of the hard carbon film is preferably in the range of 1.65 to 1.95. When the refractive index is within the range of the present invention, an antireflection function is imparted to the hard carbon film to improve the light transmittance. The refractive index of the hard carbon film of the present invention can be controlled within the above range by controlling a condition for film deposition, in particular, the gas flow rate ratio.

In the hard carbon film, the proportion of $SP^3$ in the carbon bonds determined from an analysis of an X-ray photoelectron spectroscopic spectrum is preferably 65% or more, and further preferably in the range of 65% to 90%. If the proportion of $SP^3$ is low, the film has a structure similar to graphite, and thus the light transmittance may be decreased. If the proportion of the $SP^2$ bond is high, the water-absorbing property increases, and thus durability may be degraded. On the other hand, if the proportion of $SP^3$ is high, the electrical conductivity is decreased, and the resulting film may not function as a transparent electroconductive film.

When an organosilicon compound covering layer is used as the covering layer 3, the organosilicon compound covering layer is formed by condensing an organosilicon compound such as a silane coupling agent having an organic functional group. The silane coupling agent used here is a silane coupling agent having, in its molecule, an ethoxy group or/and a methoxy group that produce a silanol by a hydrolysis reaction and further having an organic functional group composed of a fluoroalkyl group or/and a linear carbon atomic group having four or more carbon atoms. Examples of the organic functional group include a butyl group, a pentyl group, a hexyl group, an octyl group, a nonyl group, a decyl group, and groups in which at least one hydrogen of each of these functional groups is substituted with a fluoro group, a methyl group, or an ethyl group.

As for a method of forming the organosilicon compound covering layer, the layer may be formed by dipping, spraying, roll coating, or spin coating, and then drying by heating in air to naturally cause a hydrolysis reaction. However, by employing a CVD method of the present invention, variations in the characteristics between deposition lots can be decreased. In the CVD method, a silane coupling agent used as a raw material and water are separately introduced in a reaction system, and a hydrolysis reaction is conducted near the surface of a transparent electroconductive oxide to form the organosilicon compound film.

The film thickness of the organosilicon compound is preferably in the range of 5 to 50 Å, and further preferably in the range of 10 to 50 Å. A feature of such an organosilicon compound lies in the fact that a satisfactory result can be obtained by merely forming an organosilicon compound film having a thickness of a monomolecular layer on a surface of a transparent electroconductive oxide. A large thickness is not preferable because the electrical conductivity may be adversely affected.

The surface resistivity of the transparent electroconductive film was measured by a four-probe pressure contact method described in JISK 7194. The value of the surface resistivity is preferably in the range of 5 to 2,000 Ω/sq., though it depends on the characteristics required for an item used. If the surface resistivity is higher than the above range, the surface resistivity of the transparent electroconductive film is not stabilized. In particular, when the transparent electroconductive film is left to stand under a high-temperature and high-humidity environment, the surface resistivity readily increases. On the other hand, if the surface resistivity is lower than the above range, the thickness of the transparent electroconductive layer is increased. As a result, the transparent electroconductive layer is readily broken by the stress, the transmittance is decreased, and a problem in terms of cost occurs. The total light transmittance was measured with an integrating-sphere light transmittance measuring device described in JISK 7105. The refractive index and the film thickness were measured with a spectroscopic ellipsometer. The presence or absence of hydrogen was determined on the basis of the presence or absence of a peak due to a C—H stretching vibration detected around 3,000 $cm^{-1}$ in a measured infrared absorption spectrum. The proportion of the $SP^3$ bond in the structure was calculated by analyzing data of a bond energy obtained by X-ray photoelectron spectroscopy (XPS). The water contact angle was measured with a contact angle meter CA-X type manufactured by Kyowa Interface Science Co., Ltd. under the conditions of a room temperature of 25° C. and a relative humidity of 55%.

EXAMPLES

The present invention will now be specifically described on the basis of Examples, but the present invention is not limited to these Examples.

Examples 1 to 4

A hard carbon film was deposited on a surface of a polyethylene terephthalate (PET) film (trade name: COSMOSHINE A4100, manufactured by Toyobo Co., Ltd., thickness: 100 μm) by RF plasma CVD in an environment of 70 Pa. A zinc oxide transparent electroconductive oxide layer was deposited on the hard carbon film by sputtering. As for the deposition conditions, argon was used as a carrier gas and the deposition was performed in an environment of 8 Pa by applying a power of 10 W/$cm^2$ so that the zinc oxide layer of each sample had a predetermined thickness. Furthermore, a hard carbon film was deposited on the zinc oxide transparent electroconductive oxide layer by RF plasma CVD in an environment of 70 Pa. Characteristics and durability of each of the resulting transparent electroconductive films thus prepared were evaluated. The durability was evaluated by measuring the surface resistivity of the transparent electroconductive film immediately after the preparation, then measuring the surface resistivity after the transparent electroconductive film was left to stand in an environment of 60° C./90% RH for 10 days, and comparing these values.

Table 1 summarizes the experimental results of Examples 1 to 4.

TABLE 1

| | Substrate | Strcture of transparent electroconductive film | Thickness of zinc oxide layer/Å | Thickness of covering layer/Å | Raw material gas (flow rate/sccm) | Characteristics of carbon layer | | |
|---|---|---|---|---|---|---|---|---|
| | | | | | | Hydrogen | Refractive index | SP↑3/SP↑2 ratio |
| Example 1 | PET | FIG. 2 | 200 | 20 | Hydrogen/Methane (10/490) | Contained | 1.90 | 68/32 |
| Example 2 | PET | FIG. 2 | 200 | 200 | Hydrogen/Methane (10/490) | Contained | 1.90 | 68/32 |
| Example 3 | PET | FIG. 2 | 5,000 | 20 | Hydrogen/Methane (10/490) | Contained | 1.90 | 68/32 |
| Example 4 | PET | FIG. 2 | 5,000 | 200 | Hydrogen/Methane (10/490) | Contained | 1.90 | 68/32 |

| | Water contact angle/° | Light transmittance at 550 nm/% | Surface resistivity | | Degree of variation |
|---|---|---|---|---|---|
| | | | Immediately after deposition | After high-temperature high-humidity test | |
| Example 1 | 85 | 86 | 1,200 | 1,280 | 1.1 |
| Example 2 | 85 | 86 | 1,200 | 1,280 | 1.1 |
| Example 3 | 85 | 86 | 100 | 105 | 1.1 |
| Example 4 | 85 | 86 | 100 | 100 | 1.0 |

Examples 5 to 8

A hard carbon film was deposited on a surface of a polyethylene terephthalate (PET) film (trade name: COSMOSHINE A4100, manufactured by Toyobo Co., Ltd., thickness: 100 μm) by RF plasma CVD in an environment of 70 Pa. A zinc oxide transparent electroconductive oxide layer was deposited by sputtering on a surface opposite to the surface having the hard carbon film thereon. As for the deposition conditions, argon was used as a carrier gas and the deposition was performed in an environment of 8 Pa by applying a power of 10 W/cm$^2$ so that the zinc oxide layer of each sample had a predetermined thickness. Furthermore, a hard carbon film was deposited on the zinc oxide transparent electroconductive oxide layer by RF plasma CVD in an environment of 70 Pa. Characteristics and durability of each of the resulting transparent electroconductive films thus prepared were evaluated. The durability was evaluated by measuring the surface resistivity of the transparent electroconductive film immediately after the preparation, then measuring the surface resistivity after the transparent electroconductive film was left to stand in an environment of 60° C./90% RH for 10 days, and comparing these values.

Table 2 summarizes the experimental results of Examples 5 to 8.

name: OA-10, manufactured by Nippon Electric Glass Co., Ltd., thickness: 0.7 mm) by sputtering. As for the deposition conditions, argon was used as a carrier gas and the deposition was performed in an environment of 8 Pa by applying a power of 10 W/cm$^2$ so that the zinc oxide layer of each sample had a predetermined thickness. Furthermore, an organosilicon compound covering layer was formed on the zinc oxide transparent electroconductive oxide layer. The organosilicon compound covering layer was formed by using a functional silane compound of trifluoropropyltrimethoxysilane (trade name: KBM-7103), decyltrimethoxysilane (trade name: KBM-3103), or hexyltrimethoxysilane (trade name: KBM-3063) (each of which was manufactured by Shin-Etsu Chemical Co., Ltd.) as a raw material. The deposition was performed by an atmospheric pressure CVD method while controlling the flow rates such that the amount of functional silane compound and the amount of water were stoichiometrically equivalent to each other, thus forming the organosilicon compound covering layer having a thickness of 15 Å. Characteristics and durability of each of the resulting transparent electroconductive films thus prepared were evaluated. The durability was evaluated by measuring the surface resistivity of the transparent electroconductive film immediately after the preparation, then measuring the surface resistivity after the transparent

TABLE 2

| | Substrate | Strcture of transparent electroconductive film | Thickness of zinc oxide layer/Å | Thickness of covering layer/Å | Raw material gas (flow rate/sccm) | Characteristics of carbon layer | | |
|---|---|---|---|---|---|---|---|---|
| | | | | | | Hydrogen | Refractive index | SP↑3/SP↑2 ratio |
| Example 5 | PET | FIG. 3 | 200 | 20 | Hydrogen/Methane (10/490) | Contained | 1.90 | 68/32 |
| Example 6 | PET | FIG. 3 | 200 | 200 | Hydrogen/Methane (10/490) | Contained | 1.90 | 68/32 |
| Example 7 | PET | FIG. 3 | 5,000 | 20 | Hydrogen/Methane (10/490) | Contained | 1.90 | 68/32 |
| Example 8 | PET | FIG. 3 | 5,000 | 200 | Hydrogen/Methane (10/490) | Contained | 1.90 | 68/32 |

| | Water contact angle/° | Light transmittance at 550 nm/% | Surface resistivity | | Degree of variation |
|---|---|---|---|---|---|
| | | | Immediately after deposition | After high-temperature high-humidity test | |
| Example 5 | 85 | 86 | 1,200 | 1,280 | 1.1 |
| Example 6 | 85 | 86 | 1,200 | 1,280 | 1.1 |
| Example 7 | 85 | 86 | 100 | 105 | 1.1 |
| Example 8 | 85 | 86 | 100 | 100 | 1.0 |

Examples 9 to 14

A zinc oxide transparent electroconductive oxide layer was deposited on a surface of an alkali-free glass substrate (trade electroconductive film was left to stand in an environment of 60° C./90% RH for 10 days, and comparing these values.

Table 3 summarizes the experimental results of Examples 9 to 14.

TABLE 3

| | Substrate | Strcture of transparent electroconductive film | Thickness of zinc oxide layer/Å | Thickness of covering layer/Å | Silane coupling agent | Water contact angle/° | Light transmittance at 550 nm/% | Surface resistivity Immediately after deposition | Surface resistivity After high-temperature high-humidity test | Degree of variation |
|---|---|---|---|---|---|---|---|---|---|---|
| Example 9 | Glass | FIG. 1 | 200 | 15 | KBM-7103 | 85 | 90 | 1,200 | 1,280 | 1.1 |
| Example 10 | Glass | FIG. 1 | 1,000 | 15 | KBM-7103 | 85 | 90 | 90 | 100 | 1.1 |
| Example 11 | Glass | FIG. 1 | 200 | 15 | KBM-3103 | 90 | 90 | 1,200 | 1,260 | 1.1 |
| Example 12 | Glass | FIG. 1 | 1,000 | 15 | KBM-3103 | 90 | 90 | 90 | 95 | 1.1 |
| Example 13 | Glass | FIG. 1 | 200 | 15 | KBM-3063 | 90 | 90 | 1,200 | 1,260 | 1.1 |
| Example 14 | Glass | FIG. 1 | 1,000 | 15 | KBM-3063 | 90 | 90 | 90 | 95 | 1.1 |

Comparative Examples 1 to 3

A zinc oxide transparent electroconductive oxide layer was deposited on a surface of alkali-free glass or a PET film used as a transparent substrate by sputtering. As for the deposition conditions, argon was used as a carrier gas and the deposition was performed in an environment of 8 Pa by applying a power of 10 W/cm$^2$ so that the zinc oxide layer of each sample had a predetermined thickness. Characteristics and durability of each of the resulting transparent electroconductive films thus prepared were evaluated.

Comparative Examples 4 and 5

Film deposition was performed as in Examples 1 to 4 except that, as for the deposition conditions for the hard carbon film, a hard carbon film was not formed on a surface of a substrate and the flow rate ratio of hydrogen gas and methane gas was changed. Thus, transparent electroconductive films were prepared, and characteristics and durability of each of the transparent electroconductive films were evaluated.

Comparative Example 6

The method of depositing a hard carbon film was changed to a magnetron sputtering method. As for the deposition conditions, methane gas was introduced as a carrier gas at 10 sccm, and the deposition was performed in an environment of 8 Pa by applying a power of 5 W/cm$^2$. Thus, a hard carbon film with a thickness of 600 Å was formed. Characteristics and durability of the resulting transparent electroconductive film thus prepared were evaluated.

Comparative Example 7

Film deposition was performed as in Comparative Example 6 except that, as for the deposition of the hard carbon film, the carrier gas was changed to argon gas. Thus, a transparent electroconductive film was prepared, and characteristics and durability of the transparent electroconductive film were evaluated.

Table 4 summarizes the experimental results of Comparative Examples 1 to 7.

TABLE 4

| | Substrate | Strcture of transparent electroconductive film | Thickness of zinc oxide layer/Å | Thickness of covering layer/Å | Raw material gas (flow rate/sccm) | Characteristics of carbon layer Hydrogen | Characteristics of carbon layer Refractive index | Characteristics of carbon layer SP$\uparrow$3/SP$\uparrow$2 ratio |
|---|---|---|---|---|---|---|---|---|
| Comparative Example 1 | Glass | FIG. 1 | 200 | Not formed | — | — | — | — |
| Comparative Example 2 | PET | FIG. 1 | 200 | Not formed | — | — | — | — |
| Comparative Example 3 | PET | FIG. 1 | 5,000 | Not formed | — | — | — | — |
| Comparative Example 4 | Glass | FIG. 1 | 200 | 150 | Hydrogen/Methane (10/690) | Contained | 1.95 | 65/35 |
| Comparative Example 5 | Glass | FIG. 1 | 200 | 150 | Hydrogen/Methane (10/10) | Contained | 1.60 | 65/35 |
| Comparative Example 6 | Glass | FIG. 1 | 200 | 600 | Methane (10) | Contained | 1.55 | 68/32 |
| Comparative Example 7 | Glass | FIG. 1 | 200 | 600 | Argon (10) | Not contained | 1.75 | 58/42 |

| | Water contact angle/° | Light transmittance at 550 nm/% | Surface resistivity Immediately after deposition | Surface resistivity After high-temperature high-humidity test | Degree of variation |
|---|---|---|---|---|---|
| Comparative Example 1 | 40 | 82 | 1,200 | 9,000 | 7.5 |
| Comparative Example 2 | 40 | 82 | 1,800 | 15,000 | 8.3 |

TABLE 4-continued

| | Water contact angle/° | Light transmittance at 550 nm/% | Surface resistivity Immediately after deposition | Surface resistivity After high-temperature high-humidity test | Degree of variation |
|---|---|---|---|---|---|
| Comparative Example 3 | 40 | 82 | 100 | 800 | 8.0 |
| Comparative Example 4 | 45 | 90 | 1,200 | 4,000 | 3.3 |
| Comparative Example 5 | 60 | 90 | 1,200 | 2,600 | 2.2 |
| Comparative Example 6 | 30 | 92 | 1,200 | 7,500 | 6.3 |
| Comparative Example 7 | 60 | 78 | 1,200 | 1,600 | 1.3 |

Comparative Example 8

Film deposition was performed as in Examples 9 to 14 except that the functional silane compound was changed to tetramethoxysilane (trade name: KBM-13, manufactured by Shin-Etsu Chemical Co., Ltd.). Thus, a transparent electroconductive film was prepared, and characteristics and durability of the transparent electroconductive film were evaluated.

Table 5 summarizes the experimental results of Comparative Example 8.

TABLE 5

| | Substrate | Structure of transparent electroconductive film | Thickness of zinc oxide layer/Å | Thickness of covering layer/Å | Silane coupling agent | Water contact angle/° | Light transmittance at 550 nm/% | Surface resistivity Immediately after deposition | Surface resistivity After high-temperature high-humidity test | Degree of variation |
|---|---|---|---|---|---|---|---|---|---|---|
| Comparative Example 8 | Glass | FIG. 1 | 200 | 15 | KBM-13 | 70 | 90 | 1,200 | 7,400 | 6.2 |

The above results showed that even in a transparent electroconductive film using zinc oxide, by providing a hard carbon film or an organosilicon compound covering layer as a covering layer, the water contact angle of a surface of a transparent electrode can be increased, the durability under a high-temperature and high-humidity environment is improved, and a zinc oxide transparent electroconductive film having performance superior to that of known transparent electroconductive films can be formed.

INDUSTRIAL APPLICABILITY

As described above, according to the present invention, an increasing change in the surface resistivity due to an effect of the environment can be suppressed while maintaining satisfactory transparency of a transparent electroconductive film including a zinc oxide layer. In addition, the present invention can provide such an improved transparent electroconductive film at a relatively low cost in such a manner that mass production can be performed.

The invention claimed is:

1. A transparent electroconductive film comprising;
   a transparent substrate;
   a second hard carbon film;
   a transparent electroconductive oxide layer having an electroconductive side surface, which layer includes at least one layer and contains zinc oxide as a main component; and
   a first hard carbon film;
   arranged in that order,
   wherein the first hard carbon film and the second hard carbon film each have a thickness in a range of 10 to 300 Å, and
   wherein the first hard carbon film has electrical conductivity and is disposed directly on the electroconductive side surface of the transparent electroconductive oxide layer.

2. The transparent electroconductive film according to claim 1, wherein the first hard carbon film and the second hard carbon film satisfy (A) to (C) below at the same time:
   (A) a hydrogen atom that forms a carbon-hydrogen bond;
   (B) a refractive index in a range of 1.65 to 1.95; and
   (C) a proportion of $SP^3$ in bonds measured by X-ray photoelectron spectroscopy of 65% or more.

3. A process for producing the transparent electroconductive film according to claim 1, which comprises forming the first hard carbon film and the second hard carbon film by radio-frequency plasma chemical vapor deposition (CVD), wherein a methane gas and a hydrogen gas used as raw material gases are prepared as a mixed gas so as to satisfy the relationship represented by formula 1:

$$0.04 \leq V(CH_4)/(V(CH_4)+V(H_2)) \leq 0.1 \quad \text{(Formula 1)}$$

wherein $V(CH_4)$ represents a flow rate of the methane gas and $V(H_2)$ represents a flow rate of the hydrogen gas.

4. A process for producing the transparent electroconductive film according to claim 2, which comprises forming the first hard carbon film and the second hard carbon film by radio-frequency plasma chemical vapor deposition (CVD), wherein a methane gas and a hydrogen gas used as raw material gases are prepared as a mixed gas so as to satisfy the relationship represented by formula 1:

$$0.04 \leq V(CH_4)/(V(CH_4)+V(H_2)) \leq 0.1 \quad \text{(Formula 1)}$$

wherein $V(CH_4)$ represents a flow rate of the methane gas and $V(H_2)$ represents a flow rate of the hydrogen gas.

* * * * *